United States Patent
Eldridge (10) Patent No.: US 7,385,411 B2
(45) Date of Patent: Jun. 10, 2008

(54) METHOD OF DESIGNING A PROBE CARD APPARATUS WITH DESIRED COMPLIANCE CHARACTERISTICS

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/930,272

(22) Filed: Aug. 31, 2004

(65) Prior Publication Data

US 2006/0043985 A1    Mar. 2, 2006

(51) Int. Cl.
*G01R 31/02* (2006.01)
(52) U.S. Cl. ...................................................... 324/761
(58) Field of Classification Search ..................... None
See application file for complete search history.

(56) References Cited

U.S. PATENT DOCUMENTS

| 5,974,662 | A  | * | 11/1999 | Eldridge et al. ............... 29/842 |
| 6,530,266 | B1 |   | 3/2003  | Adderton et al. |
| 6,720,789 | B1 |   | 4/2004  | Audette et al. |
| 6,937,037 | B2 | * | 8/2005  | Eldridge et al. ............ 324/754 |

* cited by examiner

*Primary Examiner*—Ha Tran Nguyen
*Assistant Examiner*—Trung Q. Nguyen
(74) *Attorney, Agent, or Firm*—N. Kenneth Burraston (57) ABSTRACT

A probe card apparatus is configured to have a desired overall amount of compliance. The compliance of the probes of the probe card apparatus is determined, and an additional, predetermined amount of compliance is designed into the probe card apparatus so that the sum of the additional compliance and the compliance of the probes total the overall desired compliance of the probe card apparatus.

21 Claims, 9 Drawing Sheets

METHOD OF DESIGNING A PROBE CARD APPARATUS WITH DESIRED COMPLIANCE CHARACTERISTICS

BACKGROUND

Many applications exist for probing a device by making temporary contact with the device. For example, probes may be used to monitor operation of a device. As another example, an electronic device may be tested by probing the electronic device to establish temporary electrical connections with the device. Test data may be input to the device via the temporary connections, and response data generated by the device may be read also through the temporary connections. A probe card apparatus typically includes an array of probes that are electrically connected through a support structure to interface terminals to, for example, a tester. Often the probes, are compliant, that is, the probes deflect in response to a force.

In many probing applications, a particular level of compliance is desirable. For example, it may be desirable for the contact tips of the probes to displace a particular, predetermined distance per unit of force applied to the contact tips and to allow for a maximum deflection. Compliance may be quantified as spring constant expressed as unit of applied force per unit of deflection.

In a probing application, there may be a maximum deflection that can be applied to the probes, which results in a maximum allowable force exerted by the probes. For example, there may be a limit to the deflection that the probes can experience before a permanent deformation of the probes occurs. Permanent deformation may not be acceptable in many applications. In metallic materials, permanent deformation may occur once the probe is stressed near or above its elastic limit.

In existing probe card apparatus, the compliance of the array of probes typically dominates compliance contributions from other parts of the probe card apparatus. In fact, in designing a probe card apparatus, the compliance contribution of other parts of the probe card apparatus has traditionally been ignored. There are at least two potential disadvantages to considering only the compliance contribution of the probe array in designing and making a probe card apparatus. First, if only the compliance of the probe array is considered, the probe array must be designed to provide all of the desired compliance of the probe card apparatus. Generally speaking, the greater the compliance needed from the probe array, the larger the probes in the array need to be, and the greater the pitch or minimum spacing must be. Thus, the desired compliance level of the probe card apparatus may indirectly set a minimum size and pitch for the probe array, even though, in some applications, smaller probes and tighter pitches may be desirable or needed. Second, because other sources of compliance are not considered but nevertheless may be present, the overall compliance of the probe card apparatus may not be as accurate as expected if only the compliance of the probe array is considered when designing and making a probe card apparatus.

There is, therefore, a need for improvements in designing and making a probe card apparatus.

BRIEF SUMMARY

In a preferred embodiment of the invention, a probe card apparatus is configured to have a desired overall amount of compliance. The compliance of the probes of the probe card apparatus is determined, and an additional amount of compliance is designed into the probe card apparatus so that the sum of the additional compliance and the compliance of the probes total the overall desired compliance of the probe card apparatus.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1:
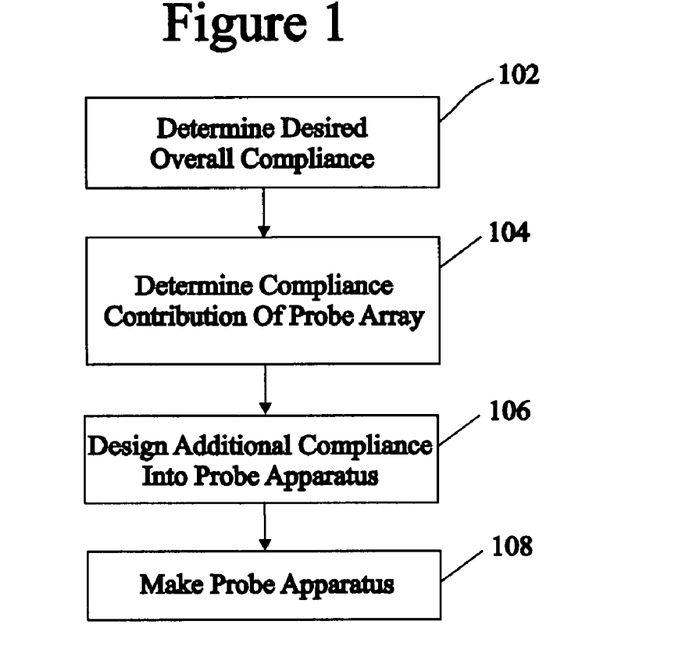
FIG. 1 illustrates an exemplary method of designing and making a probe card apparatus.

FIG. 1 illustrates an exemplary method of designing a probe card apparatus. The probe card apparatus may be any type of probe card apparatus. For example, the probe card apparatus may be used to monitor operation of a device, to read various parameters associated with a device, to test a device, etc.

As shown, at step 102, the overall level of compliance desired for the probe card apparatus is determined. The overall level of compliance will depend on the needs of the particular type of probe card apparatus and the expected use or uses of the probe card apparatus. For example, it may be desirable or necessary for the probes to exert a designed force against the device being probed. In such a case, the desired level of overall compliance may be determined by an appropriate analysis of the probing application. As another example, the desired level of overall compliance may simply be specified by a customer to whom the probe card apparatus will be delivered.

As yet another example, it may be desirable or necessary for the contact ends of the probes (e.g., the ends of the probes that make physical contact with the device being probed) to displace a given distance. For example, the larger the displacement of the probes the larger the stack up error that the probing system can tolerate There may be, however, a limit to the amount of deflection the probes may undergo due to the possibility of exceeding the elastic limit of the materials from which the probes are made. In such a case, the probe card apparatus would need to have an overall compliance sufficient to provide the needed deflection in response to the force that will be brought against the probes. Compliance may be quantified in terms of a spring constant (K), which may expressed in terms of force per deflection. In other words, K=F÷D (where K is the spring constant, F is the applied force, and D is the deflection). Thus, where the probe card apparatus is required to displace a given distance ($D_r$), but there is a maximum allowable force ($F_{max}$) that may be applied to the probe card apparatus, the required compliance may be expressed as a required spring constant ($K_r$), which may be determined as follows: $K_r=F_{max}÷D_r$.

At step 104, the compliance contribution of the probe array is determined, which may be done in any suitable manner. For example, the compliance of the probe array may be measured using a measuring instrument. Alternatively, the compliance of the probe array may be calculated. As yet another alternative, the compliance of the probe array may simply be supplied by an outside party who, for example, makes or sells the probe array. Of course the compliance of the probe array may be limited. For example, as discussed above, the size and pitch of the probes may restrict the compliance that can be obtained from the probe array. Thus, the compliance of the probe array determined at step 104 may be less than the needed overall compliance for the probe card apparatus determined at step 102.

At step 106, the difference between the overall needed compliance determined at step 102 and the compliance of the probe array determined at step 104 is determined and designed into the probe card apparatus. For example, parts of the probe card apparatus (other than the probe array) may be identified as either inherently contributing compliance or potentially contributing compliance to the probe card apparatus, and the compliance of those parts may be utilized, enhanced, or reduced so that the sum of the compliance contribution of all parts of the probe card apparatus, including the probe array, equals to within an acceptable tolerance (which may depend on the probing application) the desired overall compliance determined at step 104. At step 108, the probe card apparatus is manufactured.

The steps shown in FIG. 1 will now be discussed with reference to an exemplary, non-limiting probe card apparatus 206 that is to be designed and manufactured for use in the probing system 200 shown in FIG. 2. Reference will also be made to examples shown in FIGS. 3-6. The exemplary probe card apparatus 206 and the further examples in FIGS. 2-6 and in the following discussion of those figures are provided for illustration purposes and ease of discussion and are not to be taken as limiting.

Figure 2:
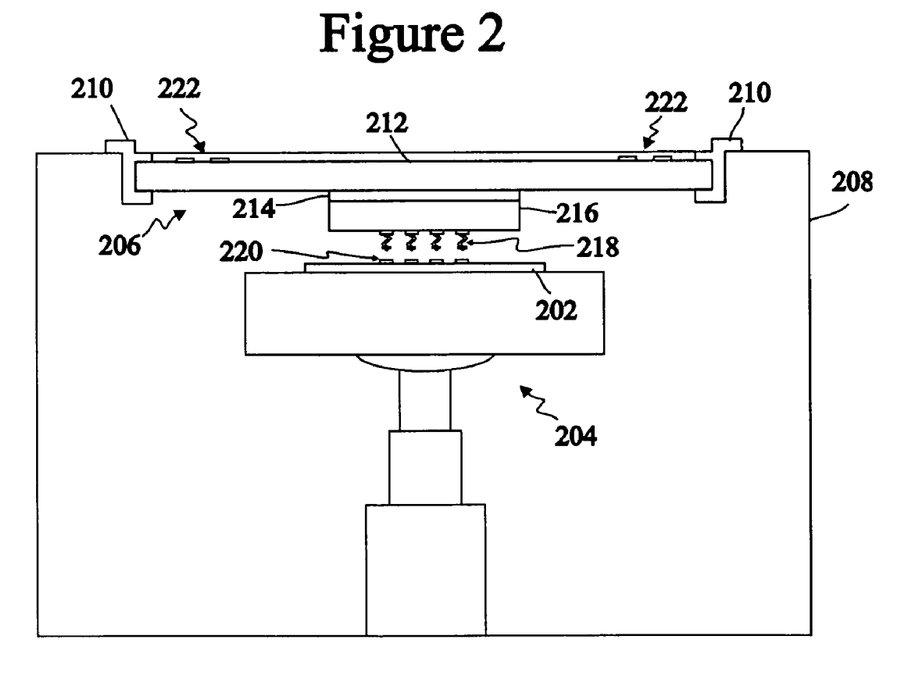
FIG. 2 illustrates an exemplary probing system, including an exemplary probe card apparatus.

FIG. 2 illustrates an exemplary system 200 for probing a device 202. Probe card apparatus 206 is to be designed and manufactured using the process shown in FIG. 1. Although the invention is not so limited, the exemplary system 200 shown in FIG. 2 is for probing an electronic device 202 to test the electronic device 202. The electronic device under test 202 (hereinafter a "device under test" will be referred to as a "DUT") may be any electronic device that is to undergo testing. For example, the DUT may be one or more of the dies of an unsingulated semiconductor wafer, one or more singulated semiconductor dies (packaged or unpackaged), one or more electronics modules, or any other type of electronic device to be tested. As mentioned above, however, the invention is not limited to probing an electronic device or to testing but may be used in any application in which a device is probed (e.g., probes make physical contact with a device).

In the example shown in FIG. 2, the DUT 202 is disposed on a moveable stage 204, which moves terminals 220 of the DUT 202 into contact with probes 218 of the probe card apparatus 206. Tester terminals 222 on probe card apparatus 206 provide an interface to a tester (not shown), which may be configured to generate test data for testing the DUT 202 and receive response data generated by the DUT 202. Electrical connections (not shown) through the probe card apparatus 206 connect ones of the tester terminals 222 with ones of the probes 218. Thus, electrical paths (not shown) for test data are provided from the tester (not shown), through the probe card apparatus 206 to input terminals 220 of the DUT 202, and similar electrical paths (not shown) for response data generated by the DUT 202 are provided from output terminals 220 of the DUT 202 through the probe card apparatus 206 to the tester (not shown). The stage 204 may be disposed in a housing 208, and the probe card apparatus 206 may be secured to the housing 208 by mounting hardware 210. The exemplary probe card apparatus 206 illustrated in FIG. 2 includes an interface board 212 and a probe substrate 216, which are connected to each other by a connector 214. The tester terminals 222 are disposed on the interface board 212, and the probes 218 are disposed on the probe substrate 216. The electrical connections (not shown) between the tester terminals 222 and the probes 218 may pass through or over the interface board 212, connector 214, and probe substrate 216.

Referring again to FIG. 1, the first step 102 in designing probe card apparatus 206 is to determine a desired overall level of compliance for the probe card apparatus 206. The desired level of overall compliance of the probe card apparatus 206 will generally depend on the circumstances, environment, needed precision, etc. of the particular probing application. (Overall compliance refers to the total compliance of the probe card apparatus 206, including compliance contributions of all parts of the probe card apparatus 206). For example, a certain level of flexibility may be needed to accommodate variations in the heights of the DUT terminals 220. Flexibility may also be needed or desired to accommodate variations in the DUT terminals 220 due to imprecision in positioning the stage 204 or imprecision in the locations of the DUT terminals 220 or probes 218 due to manufacturing imprecision or imprecision introduced due to changes in thermal expansion of the DUT 202 or parts of the probe card apparatus 206 caused by changes in the temperature around or inside the housing 208.

Referring now to step 104 of FIG. 1, the compliance of the array of probes 218 is determined. The compliance of the probe array 218 will, of course, depend on the design, configuration, and materials of the probe array. Generally speaking, larger probes may have greater compliance than smaller probes. Probe arrays having a tight pitch will generally have a small amount of compliance because the tighter the pitch of the array, the smaller the probes must be.

Figure 3A:
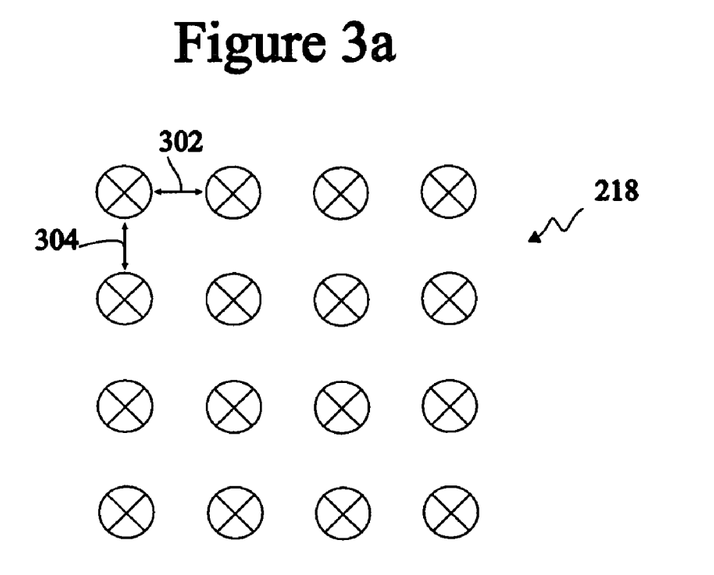
FIGS. 3a and 3b illustrate an exemplary probe array.
Figure 3B:
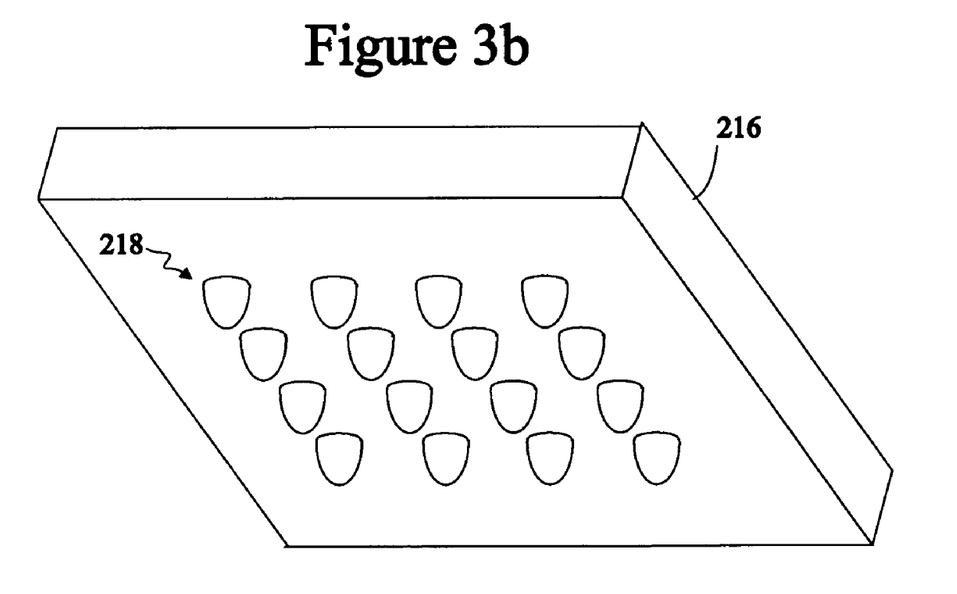

FIG. 3a and 3b show probe array 218 on probe substrate 216. Probe array 218 includes small, stubby probes, which are used in order to obtain a tight pitch. (Pitch refers to the horizontal 302 and vertical 304 distances between individual probes or tips of the probes in the probe array 218.) For example, the probes of probe array 218 may comprise short wires bonded to terminals or pads (not shown) on probe substrate 216. Alternatively, the probes of probe array 218 may be plated posts or solder bumps or lithographically defined spring elements. The material or materials that compose the probes of exemplary probe array 218 may be any suitable, conductive material. Examples include palladium, gold, rhodium, nickel, cobalt, silver, conductive nitrides, conductive carbides, tungsten, titanium, molybdenum, rhenium, indium, osmium, rhodium, copper, gold, refractory metals, silicon, gallium arsenide, etc. or their alloys including any combination of the foregoing materials. A palladium-cobalt alloy may be a particularly useful material (either as a material that composes all or most of a probe or as a coating or plating applied to some or all of a probe) for the probes of probe array 218. Using current technologies, pitches as tight as fifteen microns may be achieved. Tighter pitches may yet be achieved. Because the probes in probe array 218 are small, however, the compliance of probe array 218 is also likely to be small. For example, depending on the materials and construction of the probe array 218, the usable compliance may be negligible or relatively small (e.g., ten to twenty-five microns of deflection of the tips of the probes in probe array 218).

Probes other than short, stubby probes with small compliance, such as the probes in exemplary probe array 218, may be used. For example, any of a variety of spring probes may be used in probe array 218. Examples of such spring probes may be found in U.S. Pat. No. 5,476,211; U.S. Pat. No. 5,917,707; U.S. Pat. No. 6,336,269; U.S. Pat. No. 6,064,213; U.S. Pat. No. 6,482,013; U.S. Pat. No. 6,268,015; U.S. Published patent application No. 2001/0012739; U.S. Published patent application No. 2001/0044225; and U.S. patent application Ser. No. 09/032,473, filed Feb. 26, 1998. All of the foregoing patents and patent applications are incorporated by reference herein in their entirety. Other types of probes may alternatively be used, including without limitation needle probes, buckling beam probes, bumps, posts, etc.

Figure 3C:
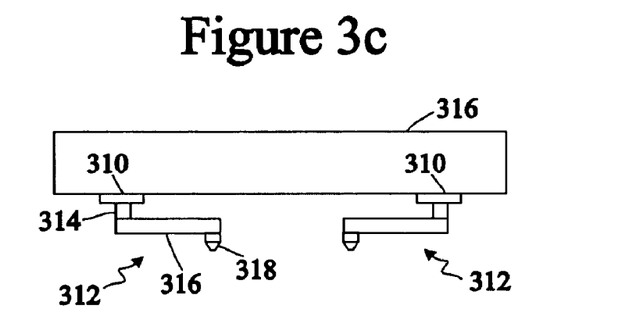
FIGS. 3c, 3d, 3e, and 3f illustrate additional exemplary probe arrays.
Figure 3D:
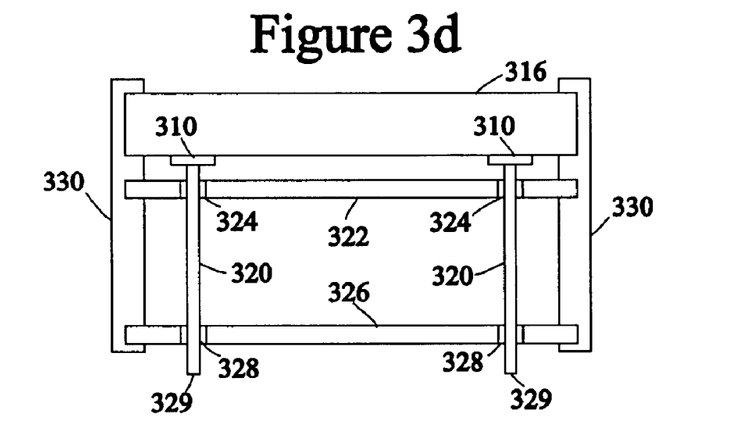
Figure 3E:
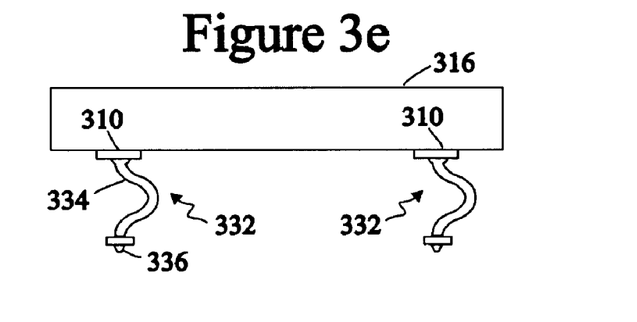
Figure 3F:
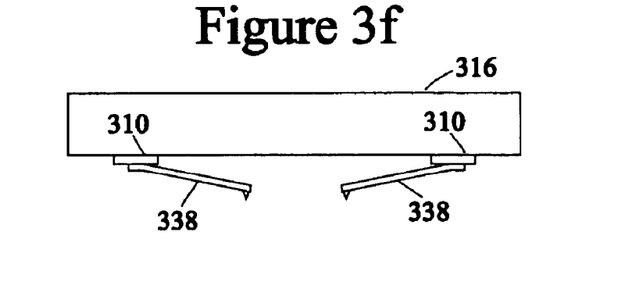

FIGS. 3c-3f illustrate non-limiting examples of alternative probes that may be used in probe array 218. FIG. 3c shows spring probes 312 attached to the terminals 310 of a probe substrate 316. Each spring probe in FIG. 3c comprises a post 314 that is attached to a terminal 310, a beam 316, and a contact tip 318, all of which may be lithographically formed. As contact tips 318 are brought into contact with an electronic device (not shown), beams 316 bend and exert a counter-force against the electronic device. FIG. 3d illustrates buckling beam probes 320, which are also attached to terminals 310 of a probe substrate 316. Each buckling beam 320 passes through holes 324, 328 in guide plates 322 and 326, which are secured to probe substrate 316 by brackets 330. As the ends 329 of the buckling beams 320 are brought into contact with an electronic device (not shown), the buckling beams 320 buckle laterally. FIG. 3e shows another example of spring probes 332, each of which is attached to a terminal 310 of a probe substrate 316. Each spring contact 332 in FIG. 3e includes a wire 334 that is bonded to a terminal 310 and a contact tip 336. As the contact tips 336 are brought into contact with an electronic device (not shown), spring probes 332 compress and exert a counter-force against the electronic device. FIG. 3f illustrates a probe substrate 316 with terminals 310 to which are attached needle probes 338.

Regardless of the type of probes used and the configuration of the probe array, the compliance of the probe array 218 may be determined in any of a number of different ways. For example, the compliance of the array may be measured using a machine that measures the deflection of the probes per unit of force applied to the probes. As another example, the compliance of the probe array may be calculated or estimated based on the type of materials used, shape of the probes, etc. As yet another alternative, the compliance of the probes or probe array may be supplied by the manufacturer or seller of the probe array 218.

It should be apparent that each probe in probe array 218 has an individual level of compliance, and the compliance of the probe array 218 is determined by the individual compliances of the probes. Indeed, the probe array 218 may be configured such that the compliance of each individual probe is independent of the compliance of the other probes in the array. Thus, each probe may provide a significantly different level of compliance than the other probes in the array. Even if each probe is designed to provide the same level of individual compliance as other probes in the array, because each probe provides an individual, independent level of compliance, one probe may displace a greater distance than another probe in the array due to, for example, different levels of force applied to the one probe as compared to the other probe.

Referring now to step 106 in FIG. 1, the difference between the desired overall level of compliance determined at step 102 for probe card apparatus 206 and the level of compliance of the probe array 218 determined at step 104 is designed into the probe card apparatus 206 at step 106. There are any number of sources of possible compliance in probe card apparatus 206. For example, all of the following elements of the probe card apparatus 206 may contribute to the overall compliance of the probe card apparatus: the mounting hardware 210 that mounts the probe card apparatus 206 to the housing 208; the interface board 212; the connector 214 connecting the probe substrate 216 to the interface board 212; and the probe substrate 216. A compliance contribution may be designed into any one or more of these or other parts of the probe card apparatus 206 at step 106 of FIG. 1. In addition, compliance may be designed out of any of these or other parts of the probe card apparatus 206 by stiffening or taking other steps to eliminate or reduce to a negligible level the compliance contribution of that part.

Figure 4:
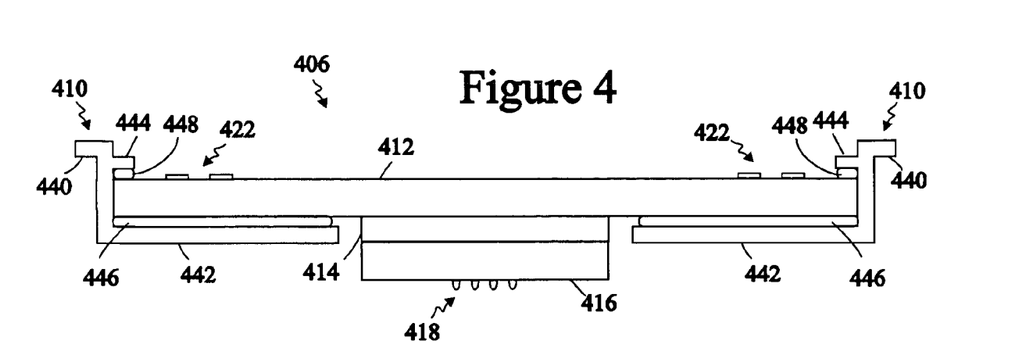
FIG. 4 illustrates an exemplary probe card apparatus.

FIG. 4 illustrates exemplary ways of designing compliance into various parts of an exemplary probe card apparatus 406, which may be generally similar to the probe card apparatus 206 of FIG. 2 with tester terminals 422 electrically connected to probes of a probe array 418 (which may be the same as probe array 218 discussed above) and mounting hardware 410 providing means for mounting the probe card apparatus 406 to a housing (e.g., like housing 208 of FIG. 2). Probe card apparatus 406 may also include an interface board 412 connected by a connector 414 to a probe substrate 416, all of which may be similar to like named elements in FIG. 2. The probe card apparatus 406 of FIG. 4 illustrates exemplary, non-limiting ways of designing compliance into the mounting hardware 410, interface board 412, connector 414, and/or probe substrate 416.

Compliance may be designed into the mounting hardware 410 as follows. As shown in FIG. 4, mounting hardware 410 includes mounting bracket 440, a lip 444 and an extension 442. Between the lip 444 and the interface board 412 is a compliant element 448, and between the interface board 412 and the extension 442 is another compliant element 446. Compliant elements 446 and 448, which may be any flexible and/or resilient material, provide a compliance contribution to probe card apparatus 406. Compliant elements 446 and 448, which may be the same or different materials, may comprise rubber, elastomer, plastic, sponge, etc. Of course compliant elements 446 and 448 may be made of a plurality of materials, including metals. The compliance of compliant elements 446 and 448 may be measured using a machine that, as discussed above, measures the deflection of the material per unit of force applied to the material or that measures the counter-force generated by the material per unit of force applied to the material. Alternatively, the compliance of compliant elements 446 and 448 may be calculated, estimated, or supplied by the manufacturer or seller of the material.

Compliance may be designed into the interface board 412 by selecting the material or materials that compose the interface board 412. For example, the interface board 412 may comprise relatively stiff materials that provide little to no (e.g., negligible) compliance. For example, a ceramic material may provide little to no compliance. Printed circuit board material may provide a small level of compliance. A rubberized material may provide a larger level of compliance. In addition to the materials that compose the interface board 412, the interface board 412 may be constructed in a manner that provides a desired level of compliance. Like compliant material 446 and 448, the compliance of the interface board 412 may be measured using a machine, calculated, estimated, or provided by the manufacturer or seller.

Figure 5A:
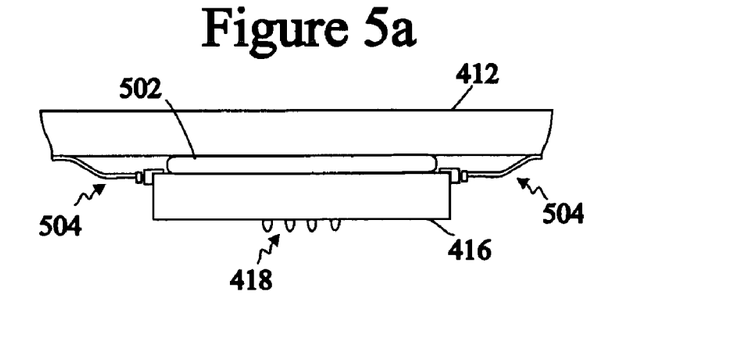
FIGS. 5a, 5b, 5c, and 5d illustrate exemplary ways of designing compliance into a connector that connects an interface board to a probe substrate.

Compliance may also be designed into the connector 414 that connects the probe substrate 416 to the interface board 412 by selection of the materials from which the connector 412 is made and/or by the design of the connector 414. FIGS. 5a, 5b, 5c, and 5d illustrate exemplary embodiments of connector 414. Each of FIGS. 5a, 5b, 5c, and 5d show a partial view of interface board 412, probe substrate 416, and probe array 418. In FIG. 5a, connector 414 is embodied as a compliant material 502, which may be similar to compliant element 446 or 448 as discussed above. Electrical connectors 504 may provide electrical connections from the tester terminals (not shown in FIG. 5a; 422 in FIG. 4) to the probe substrate 416, through which electrical connections (not shown) are provided to the probes of probe array 418. Other ways of electrically connecting interface board 412 and probe substrate 416 may be used. For example, electrically conductive passages may be provided through compliant material 502.

Figure 5B:
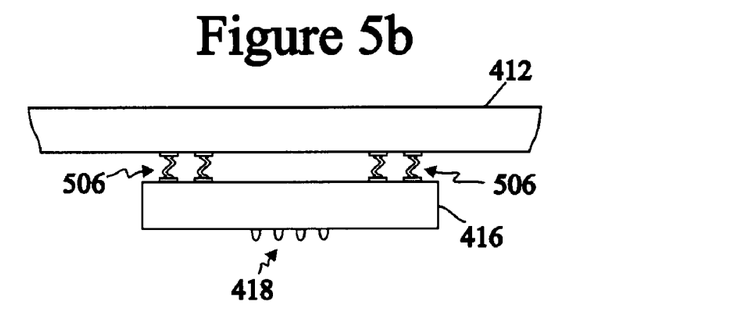

In FIG. 5b, connector 414 is embodied as a plurality of spring interconnections 506, which may be electrically conductive and provide electrical connections from interface board 412 to probe substrate 416 and thus form part of the electrical connections (not shown) from tester terminals (not shown in FIG. 5a; 422 in FIG. 4) to probe array 418. Alternatively, other electrical connections may be provided between interface board 412 and probe substrate 416 (e.g., electrical connectors 504). Spring interconnections 506 may be made in any of a variety of ways. For example, the spring interconnections 506 may be like the spring interconnections (or contacts) disclosed in any of the aforementioned patents and patent applications: U.S. Pat. No. 5,476,211; U.S. Pat. No. 6,268,015; U.S. Published patent application No. 2001/0044225; and U.S. patent application Ser. No. 09/032,473, filed Feb. 26, 1998. Other types of spring interconnections 506 may be used.

Figure 5C:
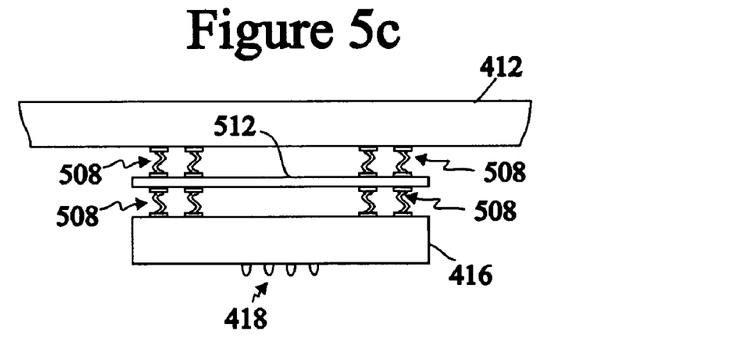

In FIG. 5c, connector 414 is embodied as an interposer comprising spring interconnections 508 extending from opposing sides of an interposer substrate 512. The spring interconnections may be electrically conductive, and there may be electrical connections (not shown) between spring interconnections 508 on one side of interposer substrate 512 and spring interconnections 508 on the opposite side of interposer substrate 512. Spring interconnections 508 and interposer substrate 512 may thus form part of the electrical connections (not shown) from tester terminals (not shown in FIG. 5a; 422 in FIG. 4) to probe array 418. Alternatively, other electrical connections may be provided between interface board 412 and probe substrate 416 (e.g., electrical connectors 504).

Figure 5D:
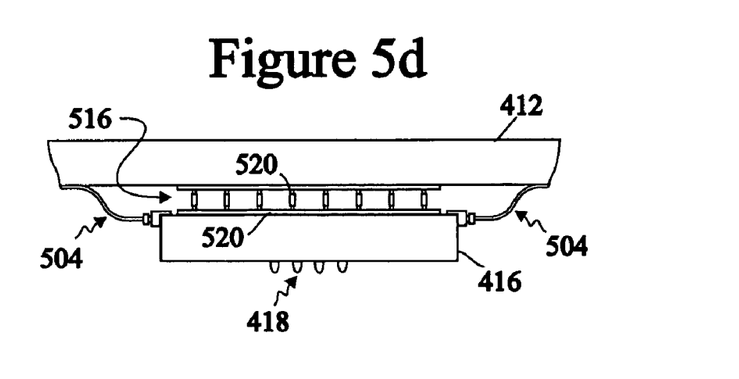

In FIG. 5d, connector 414 is embodied as a plurality of plunger spring structures 516 disposed between two flexible sheets 520, which are attached to interface board 412 and probe substrate 416. Electrical connectors 504 are provided for electrically connecting interface board 412 to probe substrate 416 and thus forming part of electrical connections between tester terminals (not shown in FIG. 5d; 422 in FIG. 4) and the probes of probe array 418. Of course, other electrical connections may be provided between interface board 412 and probe substrate 416 (e.g., electrical connectors 504). For example, plunger spring structures 516 may be configured to be electrically conductive. As another example, sheets 520 may be replaced by pads. In addition, plunger spring structures 516 may be replaced by other types of springs (e.g., coil springs, leaf springs, etc.).

Although not shown in FIGS. 5a, 5b, 5c, or 5d, probe substrate 416 may be secured to interface board 412 using any suitable mechanism. For example, brackets, frames, fasteners, etc. may be used to secure probe substrate 416 to interface board 412. It should be noted that compliant elements 446 and 448 may be implemented in any of the ways connector 414 is illustrated in FIGS. 5a, 5b, 5c, or 5d. Also, the compliance of the connector 414 may be measured using a machine that measures the deflection of the connector 414 per unit of force applied to the connector or that measures the counter-force generated by the connector per unit of force applied to the connector. Alternatively, the compliance of connector 414 may be calculated, estimated, or supplied by the manufacturer or seller.

Referring again to FIG. 4, compliance may be designed into the probe substrate 416 by selecting the material or materials that compose the probe substrate 416 in the same general manner as the compliance of interface board 412 may be selected, as generally described above. For example, the probe substrate 416 may comprise relatively stiff materials that provide little to no (e.g., negligible) compliance. For example, a ceramic material may provide little to no compliance. Printed circuit board material may provide a small level of compliance. A rubberized material may provide a larger level of compliance. In addition to the materials that compose the probe substrate 416, the probe substrate 416 may be constructed in a manner that provides a desired level of compliance. The compliance of the probe substrate 416 may be measured using a machine that measures the deflection of the probe substrate 416 per unit of force applied to the probe substrate or that measures the counter-force generated by the probe substrate per unit of force applied to the probe substrate. Alternatively, the compliance of probe substrate 416 may be calculated, estimated, or supplied by the manufacturer or seller.

Figure 6:
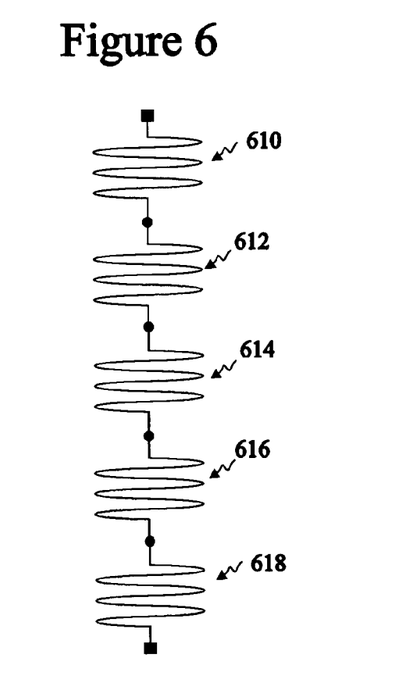
FIG. 6 illustrates a schematic diagram in which the compliance of exemplary elements of a probe card apparatus are represented schematically by springs.

FIG. 6 illustrates a schematic diagram of probe card apparatus 406 in which elements of the probe card apparatus 406 that contribute to the overall compliance of probe card apparatus 406 are depicted schematically as springs. Spring 610 represents the compliance of the mounting hardware 410, spring 612 represents the compliance of the interface board 412, spring 614 represents the compliance of the connector 414, spring 616 represents the compliance of probe substrate 416, and spring 618 represents the compliance of probe array 418. The overall compliance of the probe card apparatus 406 is the sum of the compliances of each of the probe card apparatus elements represented by springs 610, 612, 614, 616, and 618. It should be apparent that any one or more of the elements represented by springs 610, 612, 614, 616, and 618 may be designed to provide more or less of the overall compliance. In the example of probe card apparatus 416 discussed, the probe array 418 is designed to have small probes and a tight pitch. Probe array 418—represented by spring 618 in FIG. 6—and therefore is likely to contribute only a small amount of compliance. One or more other elements of the probe card apparatus 406—represented by one or more of springs 610, 612, 614, and/or 616—may therefore be designed to contribute the majority of the overall compliance of the probe card apparatus 416. For example, the probe array 418 (represented by spring 618 in FIG. 6) may contribute half, one fifth, one tenth, or even less of the overall compliance of the probe card apparatus 416. Referring to the examples given above with respect to probe array 218 shown in FIG. 3 (probe array 418 may be similar), a probe array comprising small probes with a tight pitch in the range fifteen to fifty microns might have a corresponding compliance in the range ten to twenty-five microns, which may be significantly less than the desired overall compliance of the probe card apparatus 406. In such a case, the compliance contribution of another part or other parts of the probe card apparatus 406 may need to be twice, five times, or ten times the compliance of the probe array to achieve the desired overall compliance of the probe card apparatus 406. Of course, all of the foregoing are examples only, and the probe array 418 may be designed to contribute any portion of the overall compliance from zero to all of the overall compliance of the probe card apparatus 406.

It should be noted that the compliance of a part of the probe card apparatus may be expressed as the part's spring constant K, which as discussed above, may be defined in terms of force per deflection. In other words, K=F÷D (where K is the spring constant, F is the applied force, and D is the deflection). Where compliance is expressed as a spring constant K, multiple spring constants in series, as shown in FIG. 6, are summed by inverting the sum of inverted individual spring constants: $K_{sum}=1\div((1\div K_1)+(1\div K_2)+(1\div K_3)\ldots(1\div K_n))$. Thus, the overall compliance of the series of springs 610, 612, 614, 616, and 618 shown in FIG. 6 is as follows: $K_{sum}=1\div((1\div K_{610})+(1\div K_{612})+(1\div K_{614})+(1\div K_{616})+(1\div K_{618}))$. apparent that sufficiently large spring constants K in the foregoing formula may, under appropriate circumstances, be ignored and the corresponding part of the probe card apparatus treated as providing no compliance.

Figure 7:
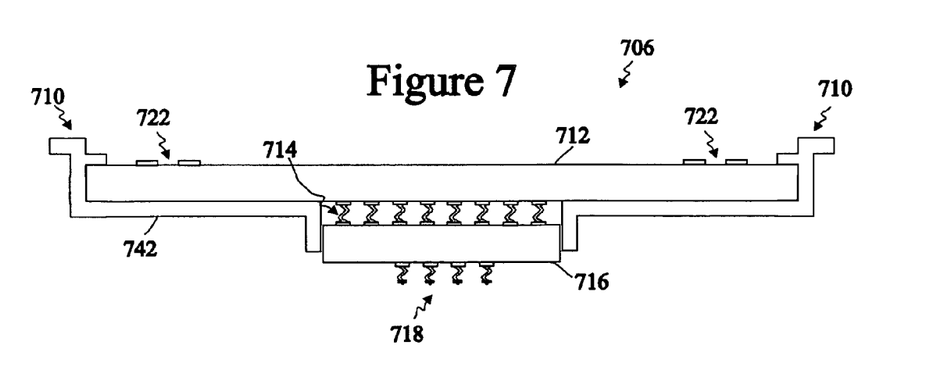
FIG. 7, FIG. 8, and FIG. 9 illustrate exemplary probe card apparatus designed to have compliance in selected parts.
Figure 8:
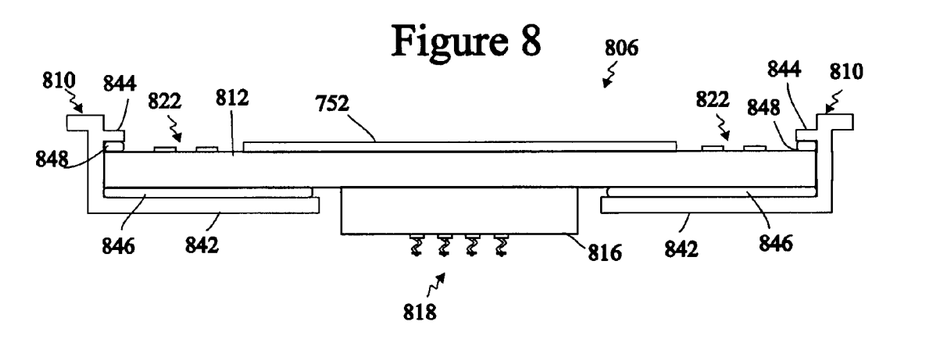

As mentioned above, compliance need not be designed into all of the elements of probe card apparatus 406 represented by the springs 610, 612, 614, 616, and 618 in FIG. 6. Indeed, steps may be taken to reduce to zero or at least to a negligible level the compliance of any one or more of the elements of the probe card apparatus 406. FIG. 7 and FIG. 8 illustrate two exemplary probe card apparatus in which only selected elements of the probe card apparatus are designed to have compliance and other elements are assumed or designed to have zero or negligible compliance.

Referring again to FIG. 1, after designing the additional compliance into the probe card apparatus 218 at step 106, the probe card apparatus 206 having the compliance components determined in steps 102, 104, and 106 is made at step 108.

Another example of designing and making a probe card in accordance with the process of FIG. 1 will now be discussed. In this example, the following scenario is assumed: the probe card apparatus is to be used in a probing system for testing DUTs, like the system shown in FIG. 2. In order to ensure good electrical connections between the probes 218 of the probe card and the terminals 220 of the DUT 202, the stage 204 may drive the terminals 220 of DUT 202 a specified distance past first contact with the terminals 220. This specified distance may be referred to as "over travel." It is also assumed for purposes of this example that the probes 218 can withstand only a limited over travel (i.e., deflection), and in this example, the compliance of the probe array 218 is insufficient to accommodate the specified over travel. That is, if the chuck 204 drives the terminals through the specified over travel, the probes will be over stressed and may be damaged. For purposes of this discussion (and not by way of limitation), the following are assumed: the probe card apparatus 206 must be able to accommodate one hundred microns of over travel; the probes of probe array 218 may safely withstand an over travel of twenty-five microns, and the probe array has a spring constant of one gram per micron (e.g., the probe array has ten probes, each having an individual spring constant of one tenth of a gram per micron).

Referring again to FIG. 1 to discuss designing and making a probe card apparatus to meet the above described exemplary specifications, the first step 102 is to determine the desired overall compliance of the probe card apparatus 218. As mentioned above, in this example, the probe card apparatus 206 needs to accommodate a total over travel of one-hundred microns when the terminals 220 of a DUT 202 are brought into contact with and pressed against the probe array 218. The overall compliance needed for the probe card apparatus thus corresponds to a deflection of one-hundred microns in response to a maximum force ($F_m$) of the terminals being pressed against the probe array 218. The overall spring constant of the probe card apparatus thus needs to be that force ($F_m$) divided by one-hundred microns: ($K_{overall}$)=$F_m$÷100 microns.

Still referring to FIG. 1, the next step 104 in designing the probe card apparatus 206 is to determine the compliance contribution of the probe array 218. As stated above, for purposes of this example, the probes in the probe array 218 may deflect a maximum of twenty-five microns. The compliance of the probe array 218 thus corresponds to deflection of twenty-five microns in response to force ($F_m$). The spring constant of the probe array 218 is thus ($F_m$) divided by twenty-five microns: ($K_{probe\ array}$)=$F_m$÷25 microns.

At step 106, the additional compliance needed in the probe card apparatus is determined. Of course, the additional needed compliance is the difference between the overall compliance needed for the probe card apparatus 206 determined at step 102 and the compliance contribution of the probe array 218 determined at step 104. Here, the additional needed compliance thus corresponds to a deflection of seventy-five microns of deflection in response to the same force ($F_m$). The spring constant of the additional needed compliance is thus ($K_{additional}$)=$F_m$÷75 microns. Thus, a compliance that corresponds to a deflection of seventy-five microns in response to the force ($F_m$)—or in other words a spring constant of $F_m$÷75 microns—needs to be designed into the probe card apparatus 208. As should be apparent, the ratio of the spring constant of the probe array ($K_{probe\ array}$) to the spring constant of the additional compliance designed into the probe card apparatus ($K_{additional}$) is three to one, which means that the probe array 218 will be three times as stiff as the compliance designed into the probe card apparatus 206. The compliance of the probe card ($K_{probe\ card}$) in this example is thus 0.33 grams/micron.

The probe card apparatus 206 is made at step 108 of FIG. 1. In response to the force (Fm) that generates the maximum allowed deflection, the probe array 218 itself deflects twenty-five microns while the probe card apparatus 206 itself deflects another seventy-five microns, all in response to the same force. The probe array 218 thus deflects a total of one-hundred microns and appears, from the perspective of the wafer, to have a spring constant of $(K_m)=F_m \div 100$ microns.

Figure 9:
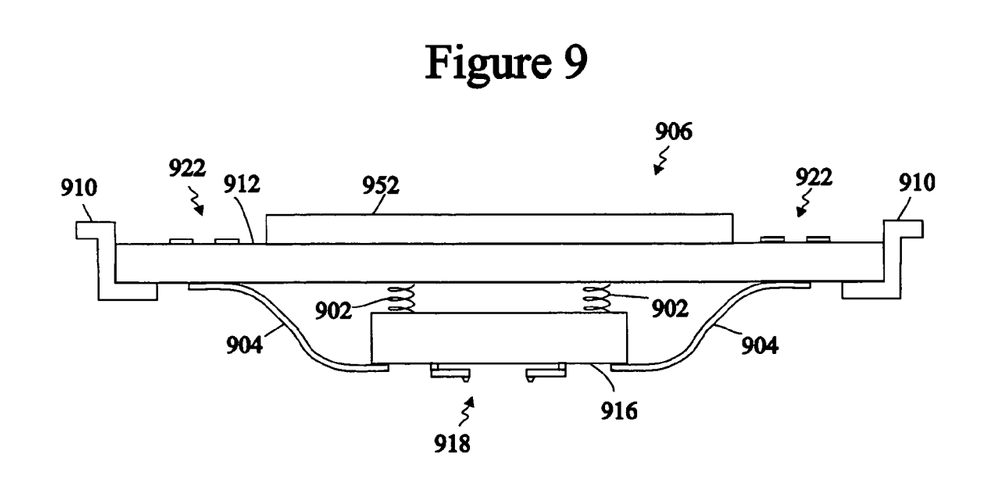

FIGS. 7-9 illustrate exemplary probe card apparatuses 706, 806, and 906 in which the additional compliance corresponding to seventy-five microns of deflection in response to a force $F_m$ and a spring constant $K_{additional}=F_m \div 75$ microns, as per the above-described example, is designed into either the connector 214 connecting the interface board 212 to the probe substrate 216 or the mounting hardware 210.

FIG. 7 illustrates an exemplary probe card apparatus 706 in which the additional compliance is designed into the interconnection between the probe substrate 716 and the interconnect board 712. Exemplary probe card apparatus 706 includes the same basic elements as probe card apparatus 206: mounting hardware 710, an interface board 712, a probe substrate 716, a probe array 718, and tester terminals 722. In the example shown in FIG. 7, probe card apparatus 706 is designed to have compliance in the connector that connects interface board 712 to probe substrate 716. That is, interface board 712 is connected to probe substrate 716 by a plurality of spring interconnections 714, which may be similar to spring interconnections 506 in FIG. 5b. Mounting hardware 710, interface board 712, and probe substrate 716 are configured to provide zero or negligible compliance. Mounting hardware 710 is stiff and secured firmly to a housing (e.g., like housing 208 in FIG. 2). Extension 742 is stiff and stiffens interface board 712, and probe substrate 716 is made of a ceramic material that has negligible compliance. Therefore, the overall compliance of probe card apparatus 706 is the sum of the compliance provided by spring interconnections 714 and probe array 718 (which would correspond to springs 614 and 618 in FIG. 6, with springs 610, 612, and 616 being negligible). In this example, spring interconnections 714 are designed to provide a compliance corresponding to seventy-five microns of deflection in response to the force Fm and a spring constant $K_{additional}=F_m \div 75$ microns, as described above.

FIG. 8 illustrates an exemplary probe card apparatus 806 in which the additional compliance is designed into the mounting hardware 810. Exemplary probe card apparatus 806 also includes the same basic elements as probe card apparatus 206: mounting hardware 810, an interface board 812, a probe substrate 816, a probe array 818, and tester terminals 822. In the example shown in FIG. 8, probe card apparatus 806 is designed to have compliance in the mounting hardware 810. That is, mounting hardware 810 includes compliant elements 844 and 846 disposed between lip 844 and extension 842, similar to FIG. 4. The connector (not shown in FIG. 8; element 414 in FIG. 4) for connecting interface board 812 to probe substrate 816, the interface board 812, and the probe substrate 816 are configured to provide zero or negligible compliance. Probe substrate 816 is rigidly secured to interface board 812 and thus the connection (not shown in FIG. 8) between the interface board 812 and the probe substrate 816 provides negligible compliance. Stiffener 852 (e.g., a metal plate secured to interface board 812) stiffens interface board 812, and probe substrate 816 is made of a ceramic material that has negligible compliance. Therefore, the overall compliance of probe card apparatus 806 is the sum of the compliance provided by the mounting hardware 810 (which includes compliant elements 844 and 846) and probe array 818 (which would correspond to springs 610 and 618 in FIG. 6, with springs 612, 614, and 616 being negligible). In this example, the mounting hardware 810 is designed to provide a compliance corresponding to seventy-five microns of deflection in response to the force $F_m$ and a spring constant $K_{additional}=F_m \div 75$ microns, as described above.

FIG. 9, like FIG. 7, illustrates an exemplary probe card apparatus 906 in which the additional compliance is designed into the interconnection between the probe substrate 916 and the interconnect board 912. Like FIGS. 7 and 8, the exemplary probe card apparatus 906 of FIG. 9 includes the same basic elements as probe card apparatus 206: mounting hardware 910, an interface board 912, a probe substrate 916, a probe array 918, and tester terminals 922. In FIG. 9, however, springs 902 (e.g., coils springs, leaf springs, etc.) are disposed between the probe substrate 916 and the interface board 912. Flexible electrical connections 904 (e.g., a flexible, thin film wiring substrate) provide electrical connections from the interface board 912 to the probe substrate 916. Vias (not shown) may be provided through interface board 912 to connect electrically tester terminals 922 to the flexible connector 904, and traces (not shown) on the probe substrate 916 may electrically connect the flexible connector 904 to the probes of probe array 918. Although the flexible connector 904 is shown in FIG. 9 connected to the probe array 918 side of probe substrate 916, the flexible connector 904 could alternatively be connected to the opposite side of the probe substrate 916, and vias and traces through probe substrate 916 could be provided to connect electrically the flexible connector 904 to the probes of probe array 918. In this example, mounting hardware 910, interface board 912, and probe substrate 916 are configured to provide zero or negligible compliance. Mounting hardware 910 is stiff and secured firmly to a housing (e.g., like housing 208 in FIG. 2). Stiffener 952 stiffens interface board 912, and probe substrate 916 is made of a ceramic material that has negligible compliance. Therefore, the overall compliance of probe card apparatus 906 is the sum of the compliance provided by spring interconnections 914 and probe array 918 (which would correspond to springs 614 and 618 in FIG. 6, with springs 610, 612, and 616 being negligible). Again, in this example, spring interconnections 902 are designed to provide a compliance corresponding to seventy-five microns of deflection in response to the force $F_m$ and a spring constant $K_{additional}=F_m \div 75$ microns, as described above.

It should be noted that the configurations shown in FIGS. 2, 4, and 7-9 are exemplary only. Any combination of the elements of a probe card apparatus (e.g., 206, 406, 706, 806, 906) represented in FIG. 6 may be selected to provide or not to provide compliance. Indeed, even the probe array (e.g., 218, 418, 718, 818, 918) may be designed to provide a particular level of compliance (including negligible compliance). As another example, the mounting hardware 210, 410, 710, 810, 910 (represented by spring 610 in FIG. 6) and probe substrate 216, 416, 716, 816, 916 (represented by spring 616 in FIG. 6) may be designed to have negligible compliance while the interface board 212, 412, 712, 812, 912 (represented by spring 612 in FIG. 6), connector 214, 414, 714, 814, 914 (represented by spring 614 in FIG. 6), and probe array 216, 416, 716, 816, 916 (represented by spring 616 in FIG. 6) are each designed to have a particular level of compliance. Any other combination of elements of a probe card apparatus may be selected, some for negligible compliance and others for a predetermined level of compliance.

Figure 10:
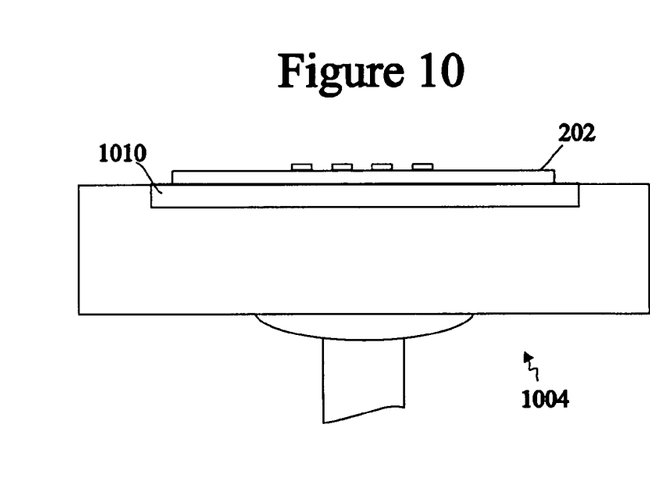
FIG. 10 illustrates an exemplary stage designed to provide compliance.

FIG. 10 illustrates another or alternative way of designing compliance into a probe card apparatus. In FIG. 10, a compliant element 1010 is built into the stage 1004, which may otherwise be like stage 204 in FIG. 2. Compliant element 1010 may be similar to compliant element 446, which is discussed above with respect to FIG. 4. Compliant element 1010 could also be made with spring interconnections or plunger springs as generally shown in FIGS. 5b, 5c, or 5d.

Figure 11:
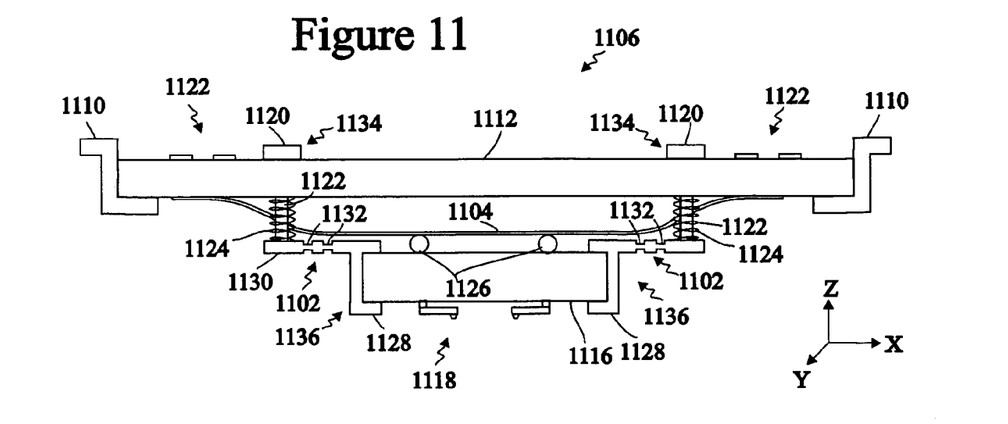
FIG. 11 illustrates an exemplary probe card apparatus with preselected compliance and a mechanism for planarizing the probes.

FIG. 11 illustrates another exemplary probe card apparatus 1106. As shown in FIG. 11, the exemplary probe card apparatus 1106 includes elements that may be generally similar to like named elements in previous figures (e.g., FIG. 9): mounting hardware 1110, an interface board 1112, tester terminals 1122, a probe substrate 1116, and an array of probes 1118. Probe card apparatus 1106 also includes one or more flexible electrical connectors 1104, which may be generally similar to flexible electrical connector 904 in FIG. 9, which is described above. Ones of tester terminals 1122 are electrically connected (not shown in FIG. 11) through interface board 1112 to ones of electrical conductors (not shown) in flexible electrical connector 1104, which in turn are electrically connected to solder balls 1126 or other electrically conductive elements. Ones of the solder balls 1126 are electrically connected (not shown in FIG. 11) through probe substrate 1116 to ones of the probes in probe array 1118. A clamp frame 1136 holds probe substrate 1116, and screws or bolts 1 34 attach the clamp frame 1136 to the interface board 1112. Clamp frame 1136 includes a holding portion 1128 for holding the probe substrate 1116 and a flange portion 1130 to which screws or bolts 1134 attach. Flange portion 1130 also includes a compliance portion 1102 that provides additional designed-in compliance to the probe card apparatus 1106, as generally described above (e.g., see step 106 of FIG. 1). Compliance portion 1102 preferably allows for compliance in the "z" direction but not in the "x" or "y" directions. FIG. 11 shows a preferred embodiment of compliance portion 1102 in which portions 1132 of the flange portion 1130 are removed. Compliance portion 1102, however, may be configured in any suitable manner (e.g., a spring material etc.).

Figure 12A:
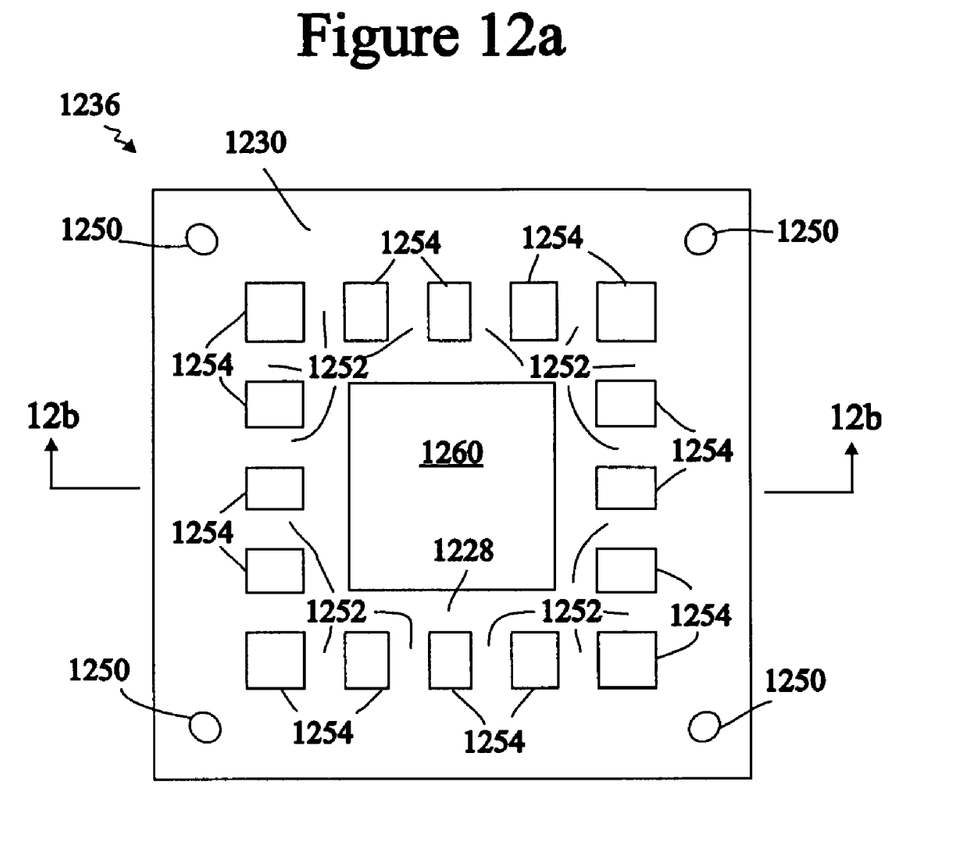
FIGS. 12a and 12b illustrate top and cross-sectional side views, respectively, of an exemplary probe substrate clamp frame 1236.
Figure 12B:
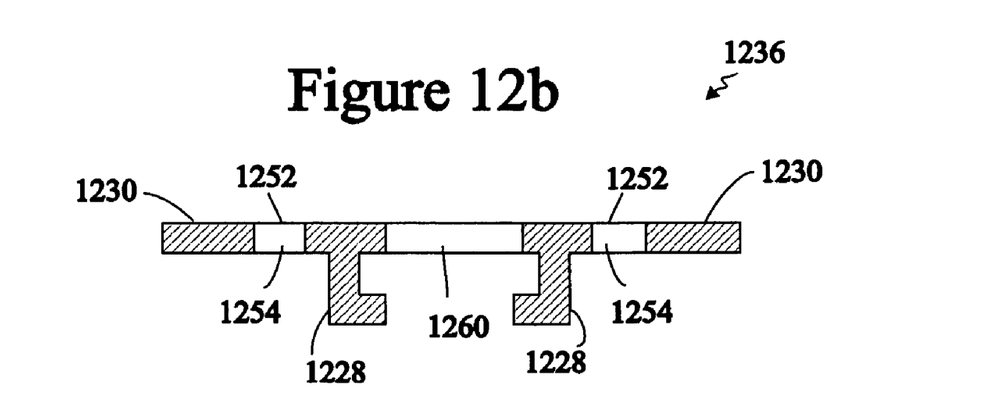

FIGS. 12a and 12b illustrate an exemplary alternative configuration of compliance portion 1102. FIGS. 12a and 12b show a top view and a cross-sectional side view, respectively, of an exemplary clamp frame 1236, which may be used in place of clamp frame 1136 in FIG. 11. Holding portion 1228, which may be like holding portion 1128 in FIG. 11, holds a probe substrate. (Opening 1260 is for the probe array on the probe substrate.) Flange portion 1230 includes threaded openings 1250 for receiving screws or bolts, which may be like screws or bolts 1134 shown in FIG. 11. Flange portion 1230 also includes several openings 1254 in between which are disposed fingers 1252, which provide compliance and thus correspond to compliance portion 1102 in FIG. 11. Fingers 1252 may comprise compliance material (e.g., spring material or flexible material), and the amount of compliance provided by clamp frame 1236 may be adjusted by removing fingers 1252.

Referring again to FIG. 11, the screws or bolts 1134 of exemplary probe card apparatus 1106 include a head 1120 and a threaded shaft 1122, which threads into threaded openings (e.g., 1250 in FIG. 12a; not shown in FIG. 11) in the flange portion 1130 of clamp frame 1136. Springs 1124 bias the clamp frame 1136 away from the interface board 1112. Springs 1124 preferably have a spring constant that is sufficiently greater than the compliance of the compliance portion 1102 such that the compliance contribution from springs 1124 is negligible. For example, the spring constant of springs 1124 may be two times, five times, ten times, one hundred times, or even more times greater than the compliance of the compliance portion 1102 or anywhere in between such numbers. By disposing a plurality of such springs 1124 and screws or bolts 1122 spaced around the flange portion 1130 of clamp frame 1136, the screws or bolts may be used to adjust a planarity of the contact tips of the probes of probe array 1118 to correspond to a planarity of terminals of an electronic device (not shown) to be probed and tested while the probe card apparatus 1106 is mounted by its mounting hardware 1110 to a prober or other testing apparatus. For example, in FIG. 12, four threaded openings 1250 are spaced about the flange portion 1230 of clamp frame 1236, which allows the planarity of the clamp frame 1236 to be adjusted with respect to the interface board 1112. In this way the planarity of the probe substrate 1116 and the contact tips of the probes of probe array 1118 are adjusted as discussed above. This is because, by adjusting one or more of the screws or bolts 1134, the probe substrate 1116 may be moved in the "z" direction and/or rotated about the "x" axis and "y" axis with respect to the interface board 1112. Screws or bolts 1134 may be replaced with other planarizing mechanisms, such as any of the planarizing mechanisms disclosed in U.S. Pat. No. 5,974,662, which is incorporated by reference herein.

Figure 13:
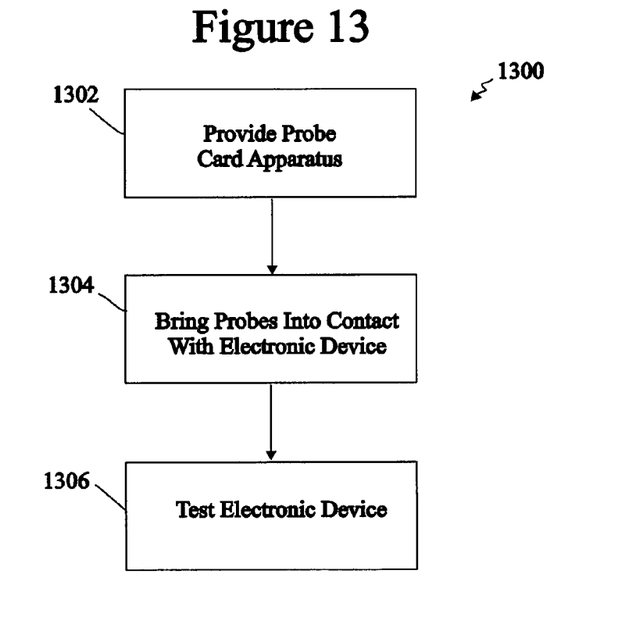
FIG. 13 illustrates a flow chart showing an exemplary method for testing electronic devices using a probe card apparatus.

FIG. 13 illustrates an exemplary method 1300 for testing electronic devices using a probe card assembly with preselected, designed-in compliance. As shown, at step 1302, a probe card assembly with preselected, designed-in compliance is provided. For example, any of the probe card assemblies described herein may be provided at step 1302. At step 1304, the probes of the probe card assembly provided at step 1302 are brought into contact with terminals of the electronic device (not shown) to be tested. At step 1306, the electronic device is tested. For example, test signals may be provided from a tester (not shown) through the probe card assembly (e.g., into tester terminals such as 1122, through probe card assembly 1106 to probes of probe array 1118 in FIG. 11) to the electronic device (not shown). Response data generated by the electronic device may similarly be sent through the probe card assembly back to the tester, which may evaluate the response data to determine whether the electronic device passed the testing.

Although exemplary embodiments and applications of the invention have been described herein, there is no intention that the invention be limited to these exemplary embodiments and applications or to the manner in which the exemplary embodiments and applications operate or are described herein. For example, although the exemplary embodiments illustrated in the figures and discussed above include an interface board and a probe substrate, a probe card apparatus having only an interface board in which the probes are attached directly to the interface board may also be used. Of course, this would eliminate not only the probe substrate but also the connector connecting the probe substrate to the interface board. As another example, a probe card apparatus with more than two substrates (that is, more than an interface board and a probe substrate) may be used. Many other variations are possible.

The invention claimed is:

1. A probe card apparatus having a preselected amount of total compliance, said probe card apparatus comprising:
   a plurality of probes configured to contact an electronic device to be tested, said plurality of probes having a first amount of compliance; and
   compliance means for providing within said probe card apparatus a selected additional amount of compliance, wherein said preselected amount of total compliance is a sum of said first amount of compliance and said selected additional amount of compliance, wherein:

said first amount of compliance corresponds to a first spring constant, which is a first ratio of force to deflection, said additional amount of compliance corresponds to a second spring constant, which is a second ratio of force to deflection, and a given amount of force displaces said probes a distance that corresponds to a sum of said first spring constant and said second spring constant.

2. The probe card apparatus of claim 1, wherein said sum corresponds to an inverse of a mathematical addition of an inverse of said first spring constant and an inverse of said second spring constant.

3. The probe card apparatus of claim 2, wherein said second spring constant is greater than said first spring constant.

4. The probe card apparatus of claim 2, wherein said spring constant of said plurality of probes comprises a sum of individual compliances of each of said probes, and wherein said individual compliances of each of said probes are independent one from another.

5. The probe card apparatus of claim 1, wherein said probe card apparatus further comprises:

a probe substrate to which said probes are attached;

an interface board comprising an interface for test signals, said probe substrate being connected to said interface board; and a mounting mechanism configured to attach said probe card apparatus to a housing.

6. The probe card apparatus of claim 5, wherein said compliance means is disposed between said probe substrate and said interface board.

7. The probe card apparatus of claim 6, wherein said compliance means comprises a compliant material.

8. The probe card apparatus of claim 7, wherein said compliant material is configured to have said second spring constant.

9. The probe card apparatus of claim 6, wherein said compliance means comprises spring mechanisms.

10. The probe card apparatus of claim 6, wherein said compliance means comprises spring interconnection elements interconnecting said probe substrate and said interface board.

11. The probe card apparatus of claim 6, wherein said compliance means comprises plunger springs.

12. The probe card apparatus of claim 6, wherein said compliance means comprises an interposer.

13. The probe card apparatus of claim 5, wherein said compliance means comprises said interface board.

14. The probe card apparatus of claim 13, wherein said interface board is configured to have said second spring constant.

15. The probe card apparatus of claim 5, wherein said compliance means comprises said probe substrate.

16. The probe card apparatus of claim 5, wherein said compliance means comprises said mounting mechanism.

17. The probe card apparatus of claim 5, wherein said compliance means comprises a compliant material disposed between said interface board and hardware for mounting said interface board to said housing.

18. The probe card apparatus of claim 17, wherein said complaint material is configured to have said second spring constant.

19. A probe card apparatus having a preselected amount of total compliance, said probe card apparatus comprising:

a plurality of probes configured to contact an electronic device to be tested, said plurality of probes having a first amount of compliance; and compliance means for providing within said probe card apparatus a selected additional amount of compliance, wherein said preselected amount of total compliance is a sum of said first amount of compliance and said selected additional amount of compliance, wherein:

said total amount of compliance corresponds to a desired over travel of said probes, said first amount of compliance corresponds to an allowable deflection of said probes, and said additional amount of compliance corresponds to a deflection of said probe card apparatus.

20. A probe card apparatus having a preselected amount of total compliance, said probe card apparatus comprising:

a plurality of probes configured to contact an electronic device to be tested, said plurality of probes having a first amount of compliance;

compliance means for providing within said probe card apparatus a selected additional amount of compliance, wherein said preselected amount of total compliance is a sum of said first amount of compliance and said selected additional amount of compliance; and means for adjusting a planarity of contact portions of said probes with respect to terminals of an electronic device to be tested.

21. A probe card apparatus having a preselected amount of total compliance, said probe card apparatus comprising:

a plurality of probes configured to contact an electronic device to be tested, said plurality of probes having a first amount of compliance; and compliance means for providing within said probe card apparatus a selected additional amount of compliance, wherein said preselected amount of total compliance is a sum of said first amount of compliance and said selected additional amount of compliance, wherein said total compliance is configured to respond to said electronic device being pressed against said probes and moved an over travel distance past first contact with said probes.

* * * * *